United States Patent
Bhat et al.

[11] Patent Number: 6,037,246
[45] Date of Patent: Mar. 14, 2000

[54] METHOD OF MAKING A CONTACT STRUCTURE

[75] Inventors: Mousumi Bhat; Mark D. Hall; Arkalgud R. Sitaram; Michael P. Woo, all of Austin, Tex.

[73] Assignee: Motorola Inc., Schaumburg, Ill.

[21] Appl. No.: 08/715,303

[22] Filed: Sep. 17, 1996

[51] Int. Cl.[7] .............................................. H01L 21/4763
[52] U.S. Cl. .................... 438/618; 438/622; 438/625; 438/637; 438/638; 438/666; 438/668; 438/672
[58] Field of Search ...................... 438/639, 622, 438/625, 666, 618, 638, 637, 668, 672

[56] References Cited

U.S. PATENT DOCUMENTS

| | | | |
|---|---|---|---|
| 4,900,695 | 2/1990 | Takahashi et al. | 437/195 |
| 4,977,105 | 12/1990 | Okamoto et al. | 437/190 |
| 5,204,286 | 4/1993 | Doan | 437/195 |
| 5,262,352 | 11/1993 | Woo et al. | 437/189 |
| 5,627,395 | 5/1997 | Witek et al. | 257/350 |

OTHER PUBLICATIONS

T.C.Chou et al, "Solid state interfacial reactions of Ti3Al with Si3N4 and SiC", 1992 Materials Research Society, J.Mater. Res., vol. 7, No. 5, May 1992, pp. 1253–1265.

J.C.Barbour et al., "Thin–film reaction between Ti and Si3N4", 1987 American Institute of Physics Applied Physics, Lett. 50 (15), Apr. 13, 1987, pp. 953–955.

T.P.Thorpe,et al., "Electrical and optical properties of Sputtered TiNx films as a function of . . . ", 1986 American Institute of Physics, Appl. Phys. Lett 49 (19), Nov. 10, 1986,pp. 1239–1241.

*Primary Examiner*—John F. Niebling
*Assistant Examiner*—Lynn A. Gurley
*Attorney, Agent, or Firm*—George R. Meyer; Joanna P. Gariazzo

[57] ABSTRACT

Electrical shorts and leakage paths are virtually eliminated by recessing conductive nodules (52) away from a conductor (72) or not forming the conductive nodules at all. In one embodiment, the refractory metal containing material (52) is recessed from the edge of the opening (32). When forming a nitride layer (54) within the opening (32), conductive nodules (52) are formed from a portion of the refractory metal containing material (20) such that the conductive modules (52) lie within the recession (42). In another embodiment, an oxide layer (82, 102) is formed adjacent to the refractory metal containing material (20) before forming a nitride layer (84, 112).

27 Claims, 5 Drawing Sheets

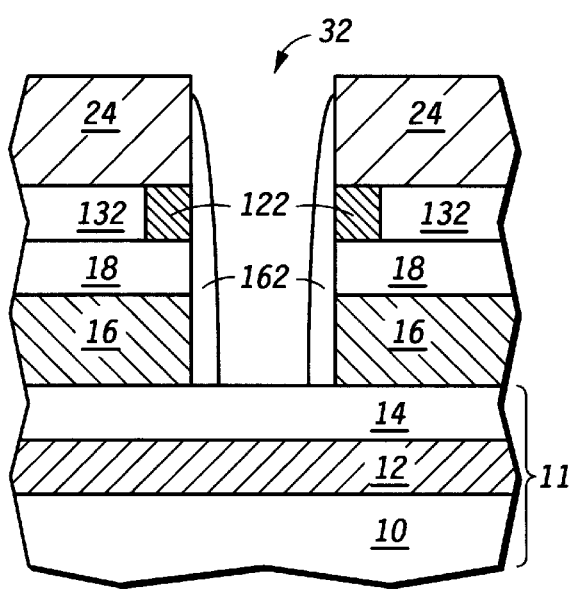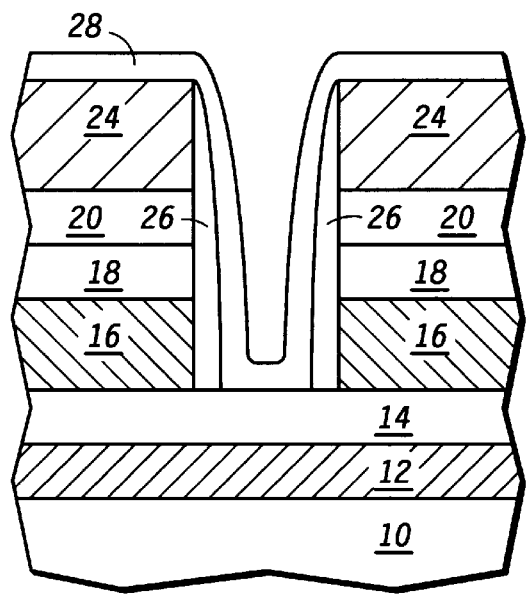
FIG.17
FIG.18
—PRIOR ART—

METHOD OF MAKING A CONTACT STRUCTURE

FIELD OF THE INVENTION

The present invention relates generally to contact structures, and more particularly, to forming contact structures within semiconductor devices.

BACKGROUND OF THE INVENTION

Critical dimensions of semiconductor devices continue to decrease with new generations of products. In the past, it was not necessary to connect one interconnecting layer with another interconnecting layer by creating an opening through an intermediate conductive layer. However, as the dimensions shrink, the requirement to form an opening through an intermediate conductive layer becomes necessary.

As illustrated, FIG. 18 includes a contact structure that has an opening through an intermediate conductive layer, wherein the contact structure is not to be electrically shorted or form electrical leakage paths between the intermediate conductive layer and the conductive layer within the contact structure. FIG. 18 includes a semiconductor substrate 10, an insulating layer 12, a conductive layer 14, another insulating layer 16, a doped semiconductor layer 18, a refractory metal silicide layer 20, and an insulating layer 24. An opening is formed that extends through layers 16–24. Silicon nitride spacers 26 are formed within the opening, and subsequently, a conductive layer 28 is formed within the opening that electrically contacts the conductive layer 14. The conductive layer 28 should be electrically insulated from the doped semiconductor layer 18 and refractory metal silicide layer 20.

A need exists for forming a multi-level contact structure including openings through intermediate conductive layers where an overlying conductive layer is not electrically connected or has an electrical leakage path to an intermediate conductive layer where the overlying conductive layer and the intermediate conductive layer are to be electrically insulated from each other.

BRIEF DESCRIPTION OF THE DRAWINGS

FIGS. 13–17 include illustrations of cross-sectional views of a portion of a substrate used to form yet another embodiment of the present invention; and FIG. 18 includes an illustration of a cross-sectional view of a contact structure (prior art).

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Embodiments of the present invention are used to virtually prevent electrical shorts and leakage paths between a first conductive layer including a refractory metal containing material and a second conductive layer lying within an opening through but electrically insulated from the first conductive layer. In one embodiment, the refractory metal containing material is recessed from the edge of the opening. When forming a nitride layer within the opening, conductive nodules are formed from a portion of the refractory metal containing material such that the conductive nodules lie within the recession. In another embodiment, an oxide layer is formed adjacent the refractory metal containing material before forming a nitride layer. The present invention is better understood after the description of embodiments that follows.

Figure 1:
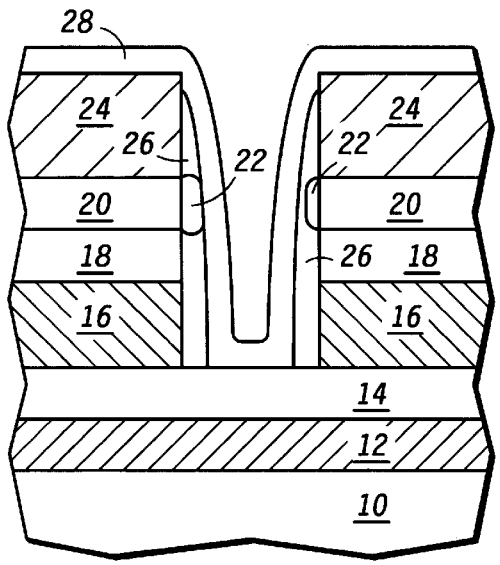
FIG. 1 includes an illustration of a cross-sectional view of a portion of a semiconductor substrate illustrating conductive nodules that electrically short an intermediate conductive layer over a substrate to a conductor within an opening.

Although FIG. 18 illustrates a theoretical representation of a contact structure, we have discovered that conductive nodules can form when forming insulating spacers. More specifically, FIG. 1 illustrates a problem that can arise when forming a silicon nitride sidewall spacer 26 in the presence of a titanium disilicide layer 20 that overlies a polysilicon layer 18. FIG. 1 includes a semiconductor substrate 10, an insulating layer 12, a conductive layer 14, another insulating layer 16, a doped semiconductor layer 18, a refractory metal silicide layer 20, and an insulating layer 24. An opening is formed that extends through layers 16–24. When forming silicon nitride spacers, ammonia or other nitrogen source reacts with the refractory metal silicide layer 20 to form conductive nodules (a conductive alloy region) 22 that may extend out from the refractory metal silicide layer 20. If the refractory metal silicide layer 20 is titanium disilicide, the conductive nodules 22 include a titanium-nitrogen compound. The silicon nitride layer is deposited within the opening and over the conductive nodules 22. The silicon nitride layer is then isotropically etched to form the spacers 26 as illustrated in FIG. 1. Subsequently, a conductive layer 28 is formed within the opening that electrically contacts the conductive layer 14 and lies along the sidewall spacers 26.

When forming the device illustrated in FIG. 1, the conductive layer 28 is to be electrically connected to conductive layer 14 but should be electrically insulated from the doped semiconductor layer 18 and the refractory metal silicide layer 20. As can be seen in FIG. 1, the conductive nodules 22 extend into the spacer 26 to reduce the effective insulating thickness of the spacer 26. In some instances, these nodules 22 are large enough where they contact the conductive layer 28 as illustrated in FIG. 1. The nodules may cause an electrical leakage path or electrical short to form between the conductive layer 28 and the refractory metal silicide layer 20. Such a structure is not desired and will form a non-functional device.

The formation of the conductive nodules is surprising because the refractory metal silicide layer 20 should have virtually no unreacted refractory metal and the silicon nitride layer is formed at a temperature no greater than 800 degrees Celsius. An article investigated reactions between elemental titanium (as opposed to molecular titanium compounds) and silicon nitride. Unlike that article, unreacted titanium is removed by an etching step after forming titanium disilicide layer (virtually no titanium in elemental form). Another article investigated reactions between titanium aluminide and silicon nitride at temperatures in a range of 1000–1200 degrees Celsius. Unlike that article, the temperature of silicon nitride formation is significantly lower. In any event, electrical shorts and leakage paths are to be avoided. However, silicon nitride spacers are favored because they can be etched selective to oxide, polysilicon, and silicide layers.

Figure 2:
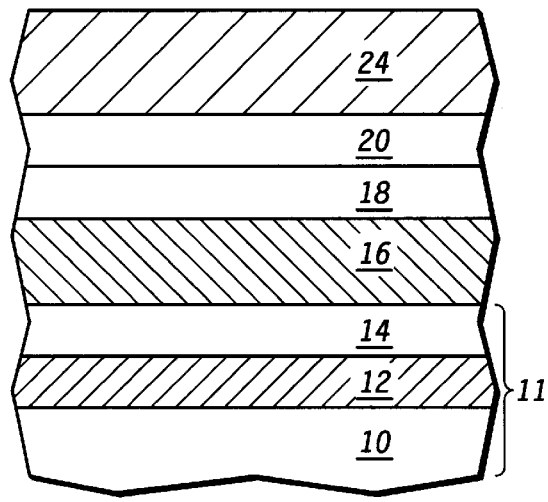
FIG. 2 includes an illustration of a cross-sectional view of a portion of a semiconductor substrate including a plurality of insulating and conductive layers.

FIG. 2 includes a portion of a substrate 11 after forming several layers. As shown in FIG. 2, the substrate 11 includes an insulating layer 12 formed over a semiconductor base material 10 and a composite conductive layer 14 formed over the insulating layer 12. In one embodiment, composite conductive layer 14 is a polysilicon layer formed by two depositions of polysilicon layers followed by a tungsten silicide deposition. The two depositions of polysilicon layers allow for formation of buried contacts. In one embodiment, the conductive layer 14 may include a doped silicon layer, a tungsten silicide layer, and an overlying amorphous silicon layer. In another embodiment, the substrate can include a conductive doped region (not shown) within the semiconductor base material 10. The conductive layer 14 has a conductive region.

Referring to FIG. 2, an insulating layer 16 overlies the conductive layer 14. A conductive layer that includes a doped semiconductor layer 18 and a refractory metal silicide layer 20 is formed over the insulating layer 16. In one embodiment, the doped semiconductor layer 18 includes N-type doped polysilicon, and the refractory metal silicide layer 20 includes titanium disilicide, tantalum silicide, tungsten silicide, cobalt silicide, or the like. The doped semiconductor layer 18 has a thickness in a range of approximately 500–4000 angstroms, and the refractory metal silicide layer 20 has a thickness in a range of 300–3000 angstroms. In a specific embodiment, the doped semiconductor layer 18 is approximately 2500 angstroms thick and the refractory metal suicide layer 20 is approximately 1200 angstroms thick. An insulating layer 24 is formed over the refractory metal silicide layer 20. Insulating layer 24 is formed using tetraethylorthosilicate (TEOS). A first portion of the insulating layer 24 is formed by plasma-enhanced chemical vapor deposition at a temperature in a range of approximately 250–400 degrees Celsius, and a second portion of the insulating layer 24 is formed by chemical vapor deposition without using a plasma at a temperature in a range of approximately 500–800 degrees Celsius.

Figure 3:
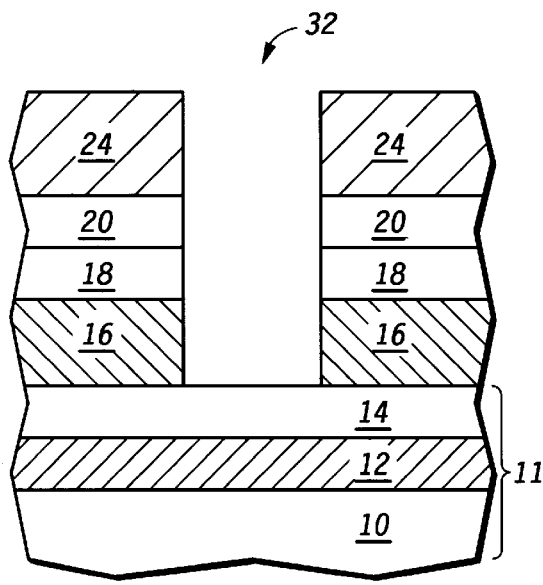
FIG. 3 includes an illustration of a cross-sectional view of the substrate of FIG. 2 after forming an opening through some of the insulating and conductive layers.

An opening 32 is formed through layers 16–24 as illustrated in FIG. 3. The chemistry used to form the opening 32 is conventional and is designed to stop on or within the conductive layer 14. Referring one specific embodiment, the etch of the opening 32 stops within the amorphous silicon layer or the tungsten silicide layer of the conductive layer 14.

Figure 4:
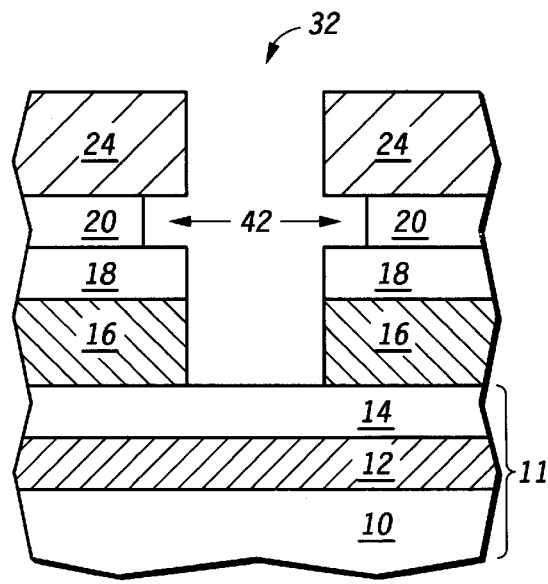
FIG. 4 includes an illustration of a cross-sectional view of the substrate of FIG. 3 after recessing one of the conductive layers in accordance with an embodiment of the present invention.

After forming opening 32, the refractory metal silicide layer 20 is laterally recessed away from the center and edges of the opening 32 to form the recession 42 as shown in FIG. 4. The recessing can be performed using wet chemical etching including hydrofluoric acid, hydrogen peroxide, or ammonium hydroxide. The opening 32 may be in a range of approximately 0.2–1.0 microns. The recession 42 is typically at least 0.25 times the thickness of the refractory metal silicide layer 20. In one embodiment this recession 42 is approximately 500 angstroms. The recession 42 should be sufficiently large enough to virtually prevent any conductive nodules from extending into the opening 32 as originally etched as shown in FIG. 3. The recession etch etches the refractory metal silicide layer 20 at a faster rate than the doped semiconductor layer 18 and the insulating layers 16 and 24.

Figure 5:
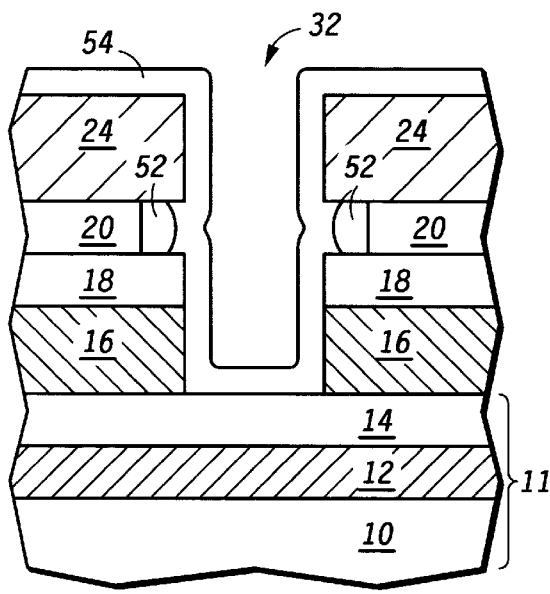
FIG. 5 includes an illustration of a cross-sectional view of the substrate of FIG. 4 after forming an insulating layer within the opening in accordance with one embodiment of the present invention.

After forming the recession 42, a silicon nitride deposition process is performed as illustrated in FIG. 5. In forming the silicon nitride layer 54, a nitrogen source gas and silicon source gas are used. During at least a portion of the initial part of the deposition, conductive nodules 52 are formed within the recess 42. The conductive nodules 52 typically include the refractory metal silicide and nitrogen. Therefore, in one embodiment the conductive nodules have a formula of $TiSi_xN_y$, which is a titanium-nitrogen compound. In FIG. 5, these conductive nodules 52 do not extend beyond the sidewalls of the opening 32 as originally formed as shown in FIG. 3. Therefore, the chances of forming an electrical short or an electrical leakage path between the refractory metal silicide layer 20 via conductive nodules 52 is virtually eliminated. The thickness of the silicon nitride layer 54 is sufficient to provide electrical insulation between the conductive nodules 52 and a subsequently formed conductor that will be formed within opening 32. In one embodiment, the thickness of the silicon nitride layer 54 overlying the insulating layer 24 has a thickness of approximately 1200 angstroms. The thickness of the silicon nitride layer, in part, determines how far the conductive nodules 52 are separated from the subsequently formed conductor within opening 32. Usually, the silicon nitride layer 54 is deposited such that the thickness overlying the insulating layer 24 is in a range of approximately 500–2000 angstroms.

Figure 6:
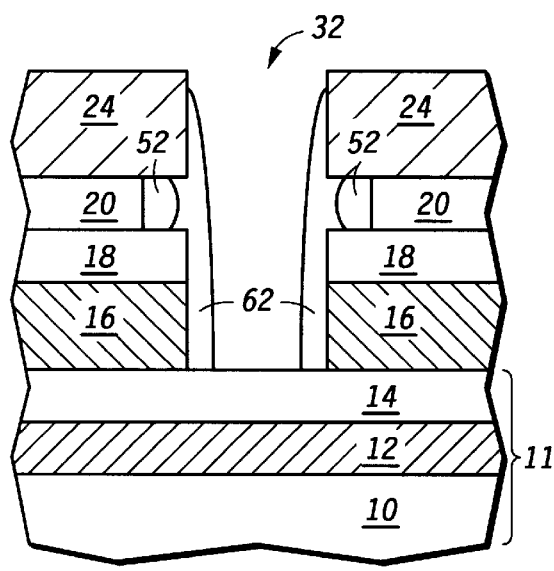
FIG. 6 includes an illustration of a cross-sectional view of a portion of the substrate of FIG. 5 after etching the insulating layer to form insulating spacers.

The silicon nitride layer 54 is then anisotropically etched to form insulating sidewall spacers 62 that are laterally adjacent to the doped semiconductor layer 18 and refractory metal silicide layer 20 as illustrated in FIG. 6. The formation of the spacers 62 includes some overetch such that the spacers lie completely within the opening 32 and are partially recessed from the top of the insulating layer 24. At the end of the etch, the spacers are approximately 1000 angstroms wide near the bottom of contact opening 32.

Figure 7:
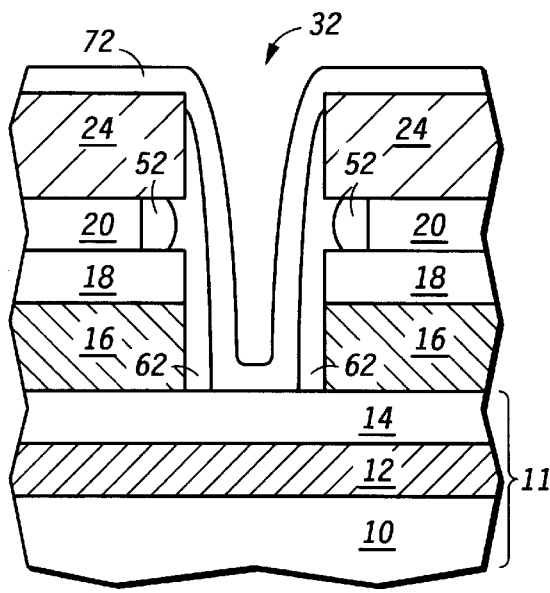
FIG. 7 includes an illustration of a cross-sectional view of the substrate of FIG. 6 after forming a conductive layer within the opening and adjacent to the insulating spacers.

After forming the spacers 62, a conductive layer 72 is formed within the opening 32 to form a substantially completed contact structure as shown in FIG. 7. The conductive layer 72 makes electrical contact to a portion of the conductive layer 14 while conductive layer 72 is electrically insulated from the conductive nodules 52.

Therefore, in this embodiment a conductive layer 72 has been formed that is electrically connected to conductive layer 14 without a substantial likelihood of forming electrical short or electrical leakage path to the conductive nodules 52 that are electrically connected to the refractory metal silicide layer 20 and doped semiconductor layer 18.

Figure 8:
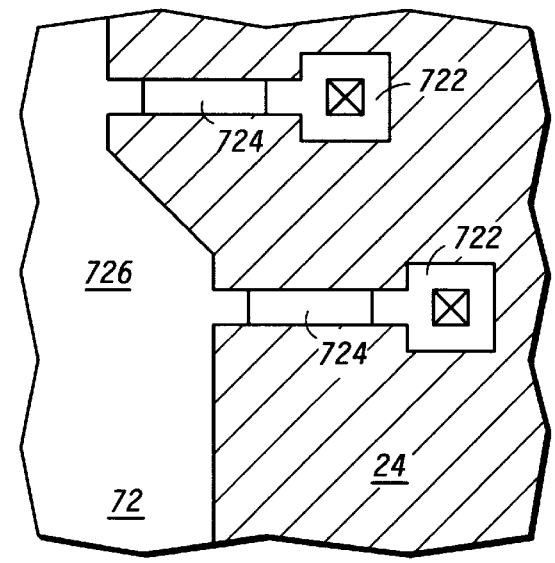
FIG. 8 includes a plan view of the conductive layer of FIG. 7.

Embodiments of the present invention are particularly useful in semiconductor devices having a plurality of conductive layers, such as static-random-access memory (SRAM) cells. Referring to FIG. 7, conductive layer 14 is part of a gate electrode for a latch transistor that is part of a storage node for the SRAM cell, and layers 18 and 20 form a grounding plane that is electrically connected to a $V_{SS}$ electrode by interconnects within the SRAM cell. Layer 72 is used to form load resistors or active regions for P-channel thin-film transistors for the SRAM cell. FIG. 8 includes a plan view of a portion of an SRAM cell 80. The uppermost exposed layers of the SRAM cell 80 include the insulating layer 24 and the conductive layer 72. Portions of the conductive layer 72 that lie within the openings 32 (not shown in FIG. 8) are illustrated by ⊠s.

The conductive layer 72 has a semiconductor material and includes heavily doped first portions 722 that are part of the storage nodes for the SRAM cell 80, lightly doped second portions 724, and a heavily doped third portion 726 that is electrically connected to a $V_{DD}$ electrode by interconnects (not shown). The lightly doped second portions are resistors if the SRAM cell 80 has load resistors or channel regions if the SRAM cell 80 has load transistors. As used in this specification, heavily doped means that the doping concentration is at least 1E19 atoms per cubic centimeter, and lightly doped means that the doping concentration is less than 1E18 atoms per cubic centimeter.

Figures 9, 10:
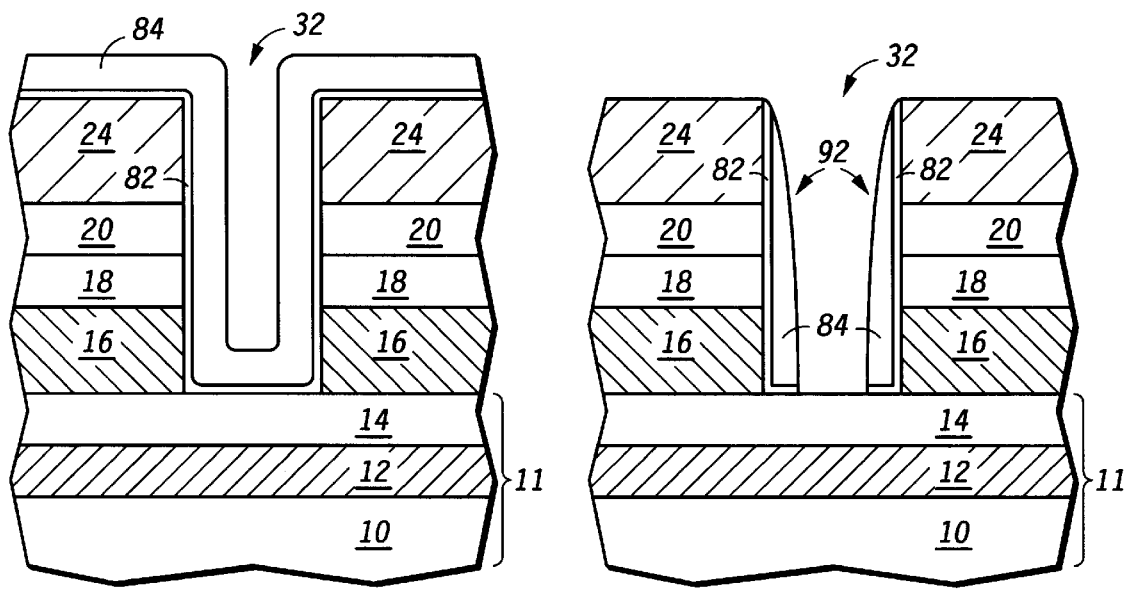
FIGS. 9–10 include illustrations of cross-sectional views of a portion of a substrate used to form another embodiment of the present invention.

In another embodiment, an oxide liner is placed between the refractory metal suicide layer 20 and a subsequently formed silicon nitride layer. Starting with the structure as illustrated in FIG. 3, a thin oxide layer 82 and a thicker silicon nitride layer 84 are formed within the opening 32 and overlying the insulating layer 24 as shown in FIG. 9. In this particular embodiment, the silicon nitride layer 84 is separated from the refractory metal silicide layer by the oxide layer 82 that typically has a thickness in the range of approximately 50–200 angstroms. The thickness of the silicon dioxide layer should be sufficient to essentially prevent any reaction or interaction between the refractory metal silicide layer 20 and the reactant gases used to form the silicon nitride layer 84 (usually ammonia and dichlorosilane). The thin oxide layer 82 can be formed using a furnace tetraethylorthosilicate (TEOS) deposition or a plasma-enhanced TEOS deposition. If a plasma-enhanced TEOS deposition is used, the thickness of the oxide layer 82 is thicker overlying the insulating layer 24 compared to along the vertical edges of the opening 32. The oxide layer 82 at the bottom of the opening 32 has a thickness somewhere between the thickness of the oxide layer along the vertical sidewalls and on top of the insulating layer 24. Again, the oxide layer 82 should be sufficiently thick along the sidewall to essentially prevent the reaction or interaction with the metal silicide layer 20 which results in formation of conductive nodules. The thickness of the nitride layer 84 is similar to that described in a previous embodiment for silicon nitride layer 54.

The nitride layer 84 and oxide layer 82 are etched to form composite spacers 92 as illustrated in FIG. 10. In this particular embodiment, the oxide layer 82 is removed over the insulating layer 24. However, in other embodiments this is not required. Still the oxide layer 82 needs to be removed from the bottom of the opening 32 to allow electrical contact to the conductive layer 14. A conductive layer similar to conductive layer 72 is then formed within the opening 32 that makes electrical contact to conductive layer 14 but is not electrically connected to the doped semiconductor layer 18 or the refractory metal silicide layer 20. The conductive layer formed within opening 32 is not illustrated in FIG. 10.

Figures 11, 12:
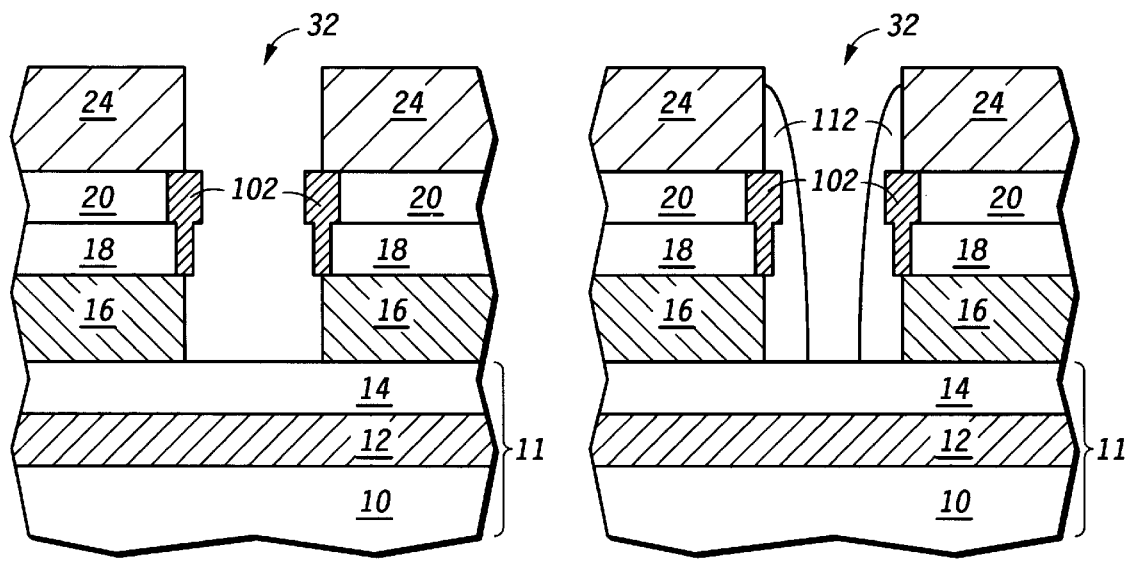
FIGS. 11–12 include illustrations of cross-sectional views of a portion of a substrate used to form still another embodiment of the present invention.

In still another embodiment, a selective oxidation is performed as illustrated in FIG. 11. More specifically starting with FIG. 3, the opening 32 has been formed to expose the conductive layer 14. After the opening 32 has been formed, an oxidation step forms thermal oxide 102 along the exposed portions of the doped semiconductor layer 18 and the refractory metal silicide layer 20. Although not illustrated, some oxide forms on the exposed surface of the conductive layer 14. However, the thickness at this point in the structure is relatively insignificant and be removed during a spacer etch.

The thermal oxide 102 is formed by a dry oxidation, wet oxidation, rapid thermal oxidation, or fast thermal oxidation. Oxidizing species for oxidation includes oxygen, ozone, water, or the like. As illustrated in FIG. 11, each of the thermal oxide 102 has different portions with different thicknesses. The portion of the thermal oxide 102 adjacent to the refractory metal silicide layer 20 has a thickness in a range of approximately 1.5–3.0 times thicker than the portion of the thermal oxide 102 that is adjacent to the doped semiconductor layer 18. Following the formation of the thermal oxide 102, a silicon nitride layer is then deposited over the insulating layer 24 and within the opening 32 and is subsequently etched to form the spacers 112 as illustrated in FIG. 12.

Figure 13:
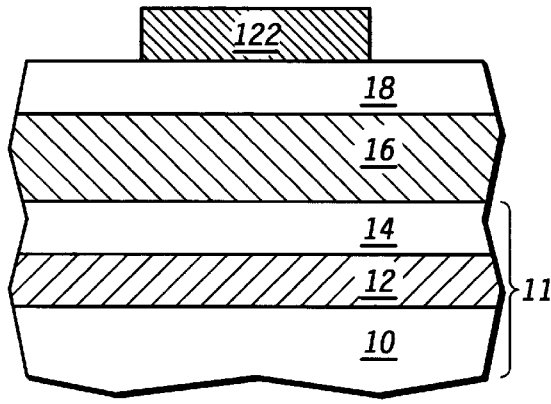
Figure 14:
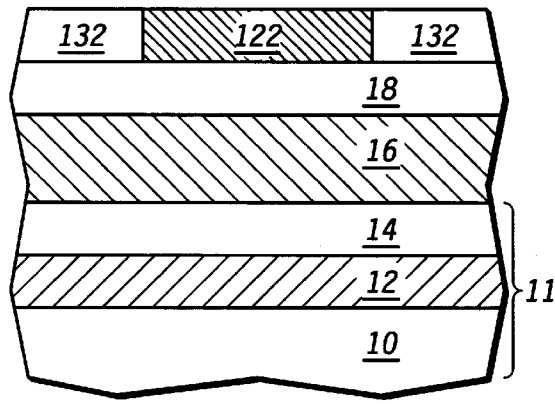

In still another embodiment, a silicide blocking layer is used to substantially reduce the formation of a refractory metal silicide near the opening for the contact structure. As illustrated in FIG. 13, a silicide blocking layer 122 is formed over the doped semiconductor layer 18. The silicide blocking layer 122 includes silicon nitride, silicon dioxide, or the like, and typically has a thickness of at least 300 angstroms. After forming the silicide blocking layer 122, it is patterned to expose portions of the doped semiconductor layer 18. A refractory metal silicide layer 132 is formed from the exposed portion of the doped semiconductor layer 18 as illustrated in FIG. 14. The thickness of the refractory metal silicide layer 132 is about the same as that is formed for the refractory metal silicide layer 20 as illustrated in earlier embodiments.

Figure 15:
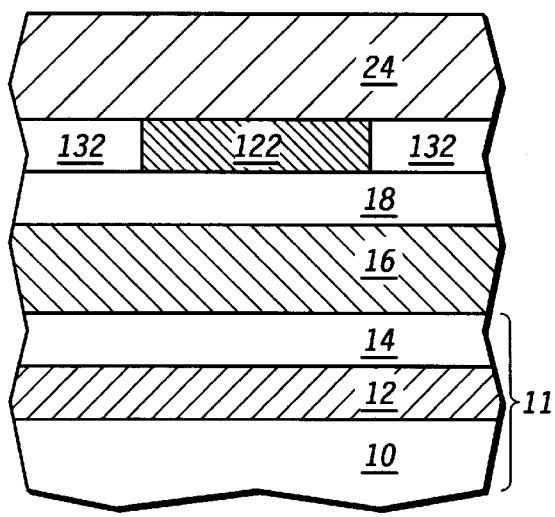
Figure 16:
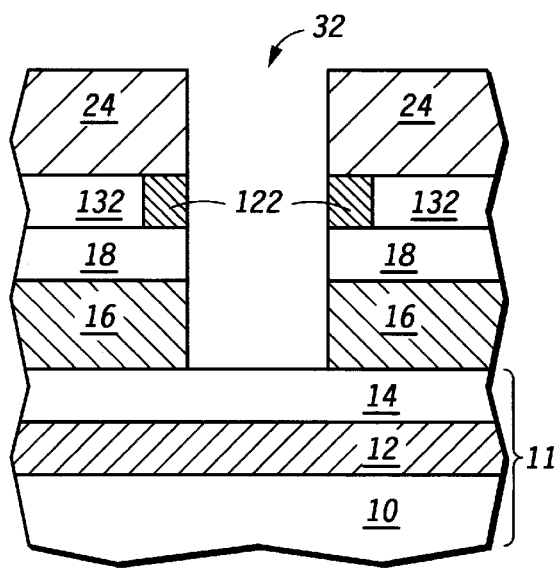

An insulating layer 24 is formed over the refractory metal silicide region 132 and silicide blocking layer 122 as illustrated in FIG. 15. An opening 32 is formed to extend down to conductive layer 14 that extends through the silicide blocking layer 122. Note that the refractory metal silicide region 132 is spaced apart from the opening 32 by remaining portions of the silicide blocking layer as shown in FIG. 16. A nitride layer is then deposited within the opening 32 and over the insulating layer 24. The nitride layer is then subsequently etched to form the spacers 162 as illustrated in FIG. 17. Spacers 162 contact the suicide blocking layer 122 at the edges of the opening 32 but do not contact the refractory metal silicide region 132. Therefore, a conductive layer subsequently formed within opening 32 will not electrically short to the refractory metal silicon region 132.

Although not illustrated in the embodiments shown in FIGS. 9–17, a conductive layer similar to conductive layer 72 is formed within the opening 32 to form a substantially completed contact structure. Additional steps are performed to form more insulating layer, metal interconnects, and a passivation layer over the uppermost interconnect level.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a contact structure comprising the steps of:
   providing a substrate having a conductive region;
   forming a first insulating layer over the conductive region;
   forming a first conductive layer over the first insulating layer, wherein the first conductive layer includes a first portion and a second portion;
   forming a second insulating layer over the first conductive layer;
   forming a opening having a depth through the second insulating layer, the first conductive layer, and the first insulating layer to expose a portion of the conductive legion and exposing a sidewall portion of the first conductive layer;
   laterally recessing the second portion of the first conductive layer so that a second portion of the opening through the second portion of the first conductive layer is wider than a first portion of the opening through the first portion of the fist conductive layer;
   after laterally recessing, forming a sidewall insulating layer laterally adjacent the sidewall portion of the first conductive layer; and
   forming a second conductive layer when the opening and extending along the entire depth of the opening, wherein:
      the second conductive layer is electrically connected to the portion of the conductive region; and
      the sidewall insulating layer electrically insulates the first conductive layer from the conductive region and the second conductive layer.

2. The process of claim 1, wherein the first portion of the first conductive layer includes a semiconductor material and the second portion of the first conductive layer includes refractory metal containing material.

3. The process of claim 1, wherein laterally recessing further comprises laterally recessing the second portion of the second conductive layer away from a center of the opening using an etch chemistry that etches the second portion faster than the second insulating layer.

4. The process of claim 2, wherein the step of forming the first conductive layer comprises steps of:
   forming a doped silicon layer; and
   forming a titanium disilicide layer.

5. The process of claim 2, wherein the step of laterally recessing is performed using a wet etch chemistry that etches the second portion at a faster rate than the first portion.

6. The process of claim 2, wherein the step of laterally recessing is performed with a chemical selected from a group consisting of hydrofluoric acid, hydrogen peroxide, and ammonium hydroxide.

7. The process of claim 1, wherein the step of forming the second insulating layer comprises steps of:
   forming a first oxide portion by chemical vapor deposition without using a plasma; and
   forming a second oxide portion by plasma-enhanced chemical vapor deposition.

8. The process of claim 1, wherein the step of providing comprises steps of:
   forming a third conductive layer over a semiconductor base material before the step of forming the first insulating layer; and
   forming a doped region within the semiconductor base material adjacent to the third conductive layer.

9. The process of claim 9, wherein the step of forming the third conductive layer is performed such that the third conductive layer is a gate electrode for a latch transistor of a static-random-access memory cell.

10. The process of claim 8, wherein the step of forming the third conductive layer comprises steps of:
    depositing a layer of polysilicon; and
    depositing a tungsten silicide layer on the layer of polysilicon.

11. The process of claim 1, further comprising a step of forming interconnects, wherein the first conductive layer is electrically connected to a $V_{SS}$ electrode.

12. The process of claim 1, wherein:
    the step of forming the opening forms a plurality of openings;
    the step of forming the second conductive layer comprises a step of forming a semiconductor layer having first portions, second portions, and a third portion, wherein:
       the first portions are heavily doped and lie within the openings;
       the second portions are lightly doped and are resistors for a static-random-access memory (SRAM) cell; and
       the third portion is heavily doped and is spaced apart from the first portions by the second portions; and
    the process further comprises a step of forming interconnects, wherein the third portion is electrically connected to a $V_{DD}$ electrode.

13. The process of claim 1, wherein:
    the step of forming the opening forms a plurality of openings;
    the step of forming the second conductive layer comprises a step of forming a semiconductor layer having first portions, second portions, and a third portion, wherein:
       the first portions are heavily doped and lie within the openings;
       the second portions are lightly doped and are channel regions for thin-film transistors of a static-random-access memory (SRAM) cell; and
       the third portion is heavily doped and is spaced apart from the first portions by the second portions; and
    the process further comprises a step of forming interconnects, wherein the third portion is electrically connected to a $V_{DD}$ electrode.

14. The process of claim 1, wherein the step of forming the sidewall insulating layer comprises steps of:
    forming an oxide layer within the opening adjacent to the first conductive layer; and
    forming a nitride layer within the opening adjacent to the oxide layer, wherein the oxide layer lies between the first conductive layer and the nitride layer.

15. The process of claim 14, wherein the step of forming the oxide layer is performed to substantially reduce chemical interaction between a chemistry used to form the nitride layer and a silicide portion of the sidewall portion of the second conductive layer.

16. The process of claim 14, wherein the step of forming the oxide layer is selected from a group consisting of chemical vapor deposition.

17. The process of claim 1, wherein the step of forming the sidewall insulating layer comprises a step of etching the nitride layer and any oxide at a bottom of the opening to form a sidewall insulating spacer as the sidewall insulating layer.

18. A process for forming a contact structure comprising the steps of:

forming a first conductive layer over a substrate;

forming a first insulating layer over the first conductive layer;

forming a second conductive layer over the first insulating layer, wherein a first portion of the second conductive layer includes a semiconductive material and a second portion of the second conductive layer includes a refractory metal containing material;

forming a second insulating layer over the second conductive layer;

forming an opening through the first and second insulating layers and the second conductive layer to expose a contact portion of the first conductive layer and exposing sidewall portions of the first and second portions of the second conductive layer;

laterally recessing the second portion of the first conductive layer so that a second portion of the opening through the second portion of the first conductive layer is wider than a first portion of the opening through the first portion of the first conductive layer;

forming a sidewall insulating layer adjacent the sidewall portions of the first and second portions of the second conductive layer; and forming a third conductive layer within the opening, wherein the third conductive layer is electrically connected to the contact portion of the first conductive layer, and wherein the sidewall insulating layer electrically insulates the second conductive layer from the first and third conductive layers.

19. The process of claim 18, wherein the step of forming the sidewall insulating layer comprises a step of forming a nitride layer, wherein reactant gases used to form the nitride layer react with the sidewall portion of the second portion of the second conductive layer to form a conductive nodule.

20. The process of claim 19, wherein the step of forming the sidewall insulating layer is performed such that the conductive nodule comprises a titanium-nitrogen compound.

21. The process of claim 19, wherein the step of forming the nitride layer, the nitride layer is deposited to a thickness such that an insulating nitride portion of the nitride layer is formed.

22. The process of claim 18, wherein the step of forming the sidewall insulating layer comprises a step of forming an oxide portion and a nitride portion, wherein the oxide portion substantially reduces a likelihood that a reactant gas used to form the nitride portion will react with the second portion of the second conductive layer.

23. The process of claim 18, wherein the step of laterally recessing is performed using a wet etch chemistry that includes a chemical selected from a group consisting of hydrofluoric acid, hydrogen peroxide, and ammonium hydroxide.

24. The process of claim 18, wherein the contact structure is part of a storage node for a static-random-access memory cell.

25. A process for forming a contact structure comprising the steps of:

forming a first conductive layer over a substrate;

forming a first insulating layer over the first conductive layer;

forming a semiconductor layer over the first insulating layer;

forming a blocking layer over the semiconductor layer to form a blocked portion and an unblocked portion of the semiconductor layer;

siliciding the unblocked portion of the semiconductor layer to form a silicide region while the blocking layer substantially prevents siliciding of the blocked portion of the semiconductor layer;

forming a second insulating layer over the silicide region;

forming an opening through the first insulating layer and blocked portion of the semiconductor layer to expose a portion of the first conductive layer and expose a sidewall portion within the blocked portion of the semiconductor layer, wherein the silicide region is spaced apart from the opening by a portion of the blocking layer;

forming a sidewall insulating layer laterally adjacent the sidewall portion of the semiconductor layer and the blocking layer; and forming a second conductive layer within the opening, wherein the second conductive layer is electrically connected to the portion of the first conductive layer, and wherein the sidewall insulating layer electrically insulates the semiconductor layer from the first and second conductive layers.

26. The process of claim 25, wherein the step of forming the blocking layer comprises steps of:

forming a nitride layer over the semiconductor layer; and patterning the nitride layer to expose the unblocked portion of the semiconductor layer.

27. The process of claim 25, wherein the step of forming the blocking layer comprises steps of:

forming an oxide layer over the semiconductor layer; and patterning the oxide layer to expose the unblocked portion of the semiconductor layer.

* * * * *